United States Patent
Ehrenreich et al.

(10) Patent No.: US 7,532,869 B2
(45) Date of Patent: May 12, 2009

(54) AUTOMATIC POWER LEVEL CONTROL CIRCUIT FOR A TRANSCEIVER DEVICE

(75) Inventors: Sebastian Ehrenreich, Dresden (DE); Lutz Dathe, Dresden (DE); Hendrik Roller, Dresden (DE)

(73) Assignee: Advanced Micro Devices, Inc., Sunnyvale, CA (US)

( * ) Notice: Subject to any disclaimer, the term of this patent is extended or adjusted under 35 U.S.C. 154(b) by 599 days.

(21) Appl. No.: 10/327,170

(22) Filed: Dec. 20, 2002

(65) Prior Publication Data
US 2004/0198272 A1    Oct. 7, 2004

(30) Foreign Application Priority Data
Oct. 30, 2002    (DE)    ................. 102 50 612

(51) Int. Cl.
*H01Q 11/12*    (2006.01)
*H04B 1/04*    (2006.01)

(52) U.S. Cl. .................. 455/127.4; 455/69; 455/127.5; 341/139; 341/140

(58) Field of Classification Search .............. 455/127.1, 455/127.2, 127.4, 69, 127.5, 126, 522, 324, 455/120, 115, 114, 127.3; 375/219, 220, 375/295; 341/139, 140, 144, 145
See application file for complete search history.

(56) References Cited

U.S. PATENT DOCUMENTS

| | | | | |
|---|---|---|---|---|
| 5,287,555 A | * | 2/1994 | Wilson et al. ............. | 455/115.1 |
| 5,566,363 A | * | 10/1996 | Senda ......................... | 455/126 |
| 5,631,930 A | * | 5/1997 | Sasaki ........................ | 375/296 |
| 5,832,022 A | * | 11/1998 | Scott .......................... | 375/142 |
| 5,886,657 A | * | 3/1999 | Ahuja ........................ | 341/144 |
| 6,038,432 A | * | 3/2000 | Onoda ....................... | 455/127.2 |
| 6,442,380 B1 | * | 8/2002 | Mohindra ................. | 455/234.1 |
| 6,493,541 B1 | | 12/2002 | Gunnarsson et al. | |
| 6,539,213 B1 | * | 3/2003 | Richards et al. .......... | 455/226.3 |
| 6,560,448 B1 | * | 5/2003 | Baldwin et al. .......... | 455/234.1 |

(Continued)

FOREIGN PATENT DOCUMENTS

DE    4291719    5/1992

(Continued)

OTHER PUBLICATIONS

English translation of Office Action with regard to patent application No. DE 10250612.4-53 mailed Oct. 23, 2003.

*Primary Examiner*—Edward Urban
*Assistant Examiner*—Christian A Hannon
(74) *Attorney, Agent, or Firm*—Meyertons Hood Kivlin Kowert & Goetzel, P.C.

(57) ABSTRACT

An automatic power level control circuit provides output power control of a transmitter device as used in wireless LAN applications in that an output signal is detected and a corresponding control voltage of a DAC in the base band section is corresponding adjusted. Preferably, the measurement of the output power is carried out during a first transmit cycle and the DAC is adjusted after completion of the first transmit cycle and prior to the begin of a subsequent transmit cycle. Thus, a reliable output level control is obtained with a minimum number of radio frequency components, wherein the control loop shows an enhanced stability due to the time-discrete control operation.

17 Claims, 2 Drawing Sheets

U.S. PATENT DOCUMENTS 6,671,267 B1 * 12/2003 Yano et al.
6,727,754 B2 * 4/2004 Dupuis et al. ............... 330/254
6,788,744 B1 * 9/2004 Hirama ...................... 375/297
6,871,055 B2 * 3/2005 Hirano et al. ............... 455/310
7,277,678 B2 * 10/2007 Rozenblit et al. ............ 455/91
2003/0227964 A1 * 12/2003 Honkanen et al. ........... 375/216

FOREIGN PATENT DOCUMENTS

DE    4294579    10/1992
DE    19959403   12/1999

* cited by examiner

AUTOMATIC POWER LEVEL CONTROL CIRCUIT FOR A TRANSCEIVER DEVICE

FIELD OF THE PRESENT INVENTION

Generally, the present invention relates to wireless communication systems, such as wireless local area networks (WLAN), mobile 'phones, and the like, and more particularly relates to the control of the radio frequency transmission power output by these wireless communication devices.

DESCRIPTION OF THE PRIOR ART

Currently great efforts are being made to develop transmitter/receiver devices, in following referred to transceiver devices, offering a high degree of reliability at low cost. A key issue in this respect is the degree of integration with which a corresponding transceiver device may be manufactured. While for many applications, such as WLAN devices, this is of great importance due to cost-effectiveness, in other applications, such as mobile 'phones, or WLAN devices in mobile computers, the low power consumption is of primary concern.

Presently, mainly two major architectures for transceiver devices are competing on the market, wherein due to the high degree of integration and the potential for reduction of power consumption, the so-called direct conversion architecture seems to become the preferred technology compared to the so-called super-heterodyne architecture. Super-heterodyne transceivers down-and-up convert the radio frequency (RF) signal to and from the lower intermediate frequency (IF) signal that may be filtered, amplified or otherwise processed more conveniently. Although the super-heterodyne architecture is well established and allows the fabrication of reliably operating transceiver devices, the highly selective RF filters that are necessary for the proper operation of these devices, require the employment of capacitors and inductors of high quality, thereby restricting the degree of integration achievable with a super-heterodyne architecture, since high quality inductors may not easily be incorporated into a semiconductor substrate. Moreover, the amplifiers operating at the relatively high RF require moderately large drive currents to provide for the required gain factor so that the power consumption of these devices may not be reduced to a level comparable to an amplifier operating at low frequencies.

In direct conversion transceivers, the received RF signal is directly down-converted to a DC level, i.e. the IF is 0, or the so-called band base signal is directly up-converted to the RF, so that the required filters and amplifiers, except for the amplifiers in the input and output stages and the corresponding filters, may operate at base band frequencies. This allows the required filters to be integrated into a chip bearing all or most of the circuitry, while at the same time power consumption is significantly lower than in the super-heterodyne architecture.

Irrespective of the architecture used in transceiver devices, in many applications it is highly desirable to control an output power of the transmitter section of the device, for example, in view of power consumption—especially for mobile applications—reduced signal interference with other transceiver devices, environmental concerns and the like.

Therefore, in many conventional transceiver devices the output power is sampled and compared with a reference signal, wherein the gain of an output driver is altered on the basis of a difference of the reference signal and the sampled output signal so as to obtain a desired output power level.

For example, U.S. Pat. No. 6,009,119 describes a radio frequency transceiver device that adaptively maintains power output level linearity across a broad spectrum of transmitting frequencies. To this end, a small defined fraction of the output power signal is routed to an envelope detector to obtain a DC signal representative of the currently prevailing output level. The signal of the envelope detector is then appropriately level-shifted and fed into an ADC, the output value of which is provided to a microprocessor. The microprocessor then compares the value of the ADC with a corresponding table stored in a non-volatile storage medium to calculate a suitable correction value for a bias voltage supplied to the output driver. A calculated value is provided to a DAC which delivers the appropriate bias voltage to the output driver. Although the output power level control system shown in U.S. Pat. No. 6,009,119 allows to substantially maintain a desired output power level, a significant number of circuit elements including an advanced microprocessor with a non-volatile storage element, such as a flash memory, as well as a DAC coupled to the output driver stage is necessary and renders this system costly and bulky.

In view of the above problems a need exists for a highly efficient output power level control system that allows a stable, reliable control of the output power of a transmitter section, while the number of circuit elements and thus the required chip area for the control circuit is minimal.

SUMMARY OF THE INVENTION

Generally, the present invention is directed at a transceiver device including an automatic power level control system that allows a reliable and stable control of the output power with reduced complexity, wherein an output power is sampled and a correction is made in the base band section, and/or the output power is corrected on the basis of different transmit cycles that are separated from each other in time, thereby enhancing accuracy and/or stability of the control loop.

According to one illustrative embodiment a radio frequency transmitter comprises a base band stage including a digital to analog converter having an input for receiving an adjustable control voltage. The transmitter further comprises a radio frequency (RF) output stage coupled to the base band stage and is configured to up-convert a base band signal to an amplified radio frequency output signal. Moreover, an automatic power level control circuit is provided and includes a detector circuit having a detector input and a detector output, wherein the detector circuit input is connected to the RF output stage to receive at least a portion of the radio frequency output signal. Furthermore, a compare circuit having a compare input and a compare output is included in the automatic power level control circuit, wherein the compare input is configured to receive an output signal from the detector output and a reference signal. The compare output is connected to the digital to analog converter, wherein the compare circuit is further configured to adjust the control voltage of the digital to analog converter on the basis of the detector output signal and the reference signal.

In a further illustrative embodiment, a method of controlling an output power of a radio frequency transmitter comprises the detection of an output power level during a first transmit cycle and comparing a detection signal of the first transmit cycle with a predefined reference signal. Then, an output power level for a second transmit cycle is adjusted on the basis of a comparison result attained during comparing the detection signal of the first transmit cycle and the predefined reference signal.

In still another illustrative embodiment, a method of controlling an RF output power level of a direct-conversion transceiver device for WLAN application comprises detecting the output power level and establishing a control signal on the basis of the detection. Additionally, a base band signal is controlled on the basis of the control signal to adjust the output power level.

BRIEF DESCRIPTION OF THE DRAWINGS

Further advantages, objects and embodiments of the present invention are defined in the appended claims and will become more apparent with the following detailed description when taken with reference to the accompanying drawings, in which:

DETAILED DESCRIPTION

Figure 1A:
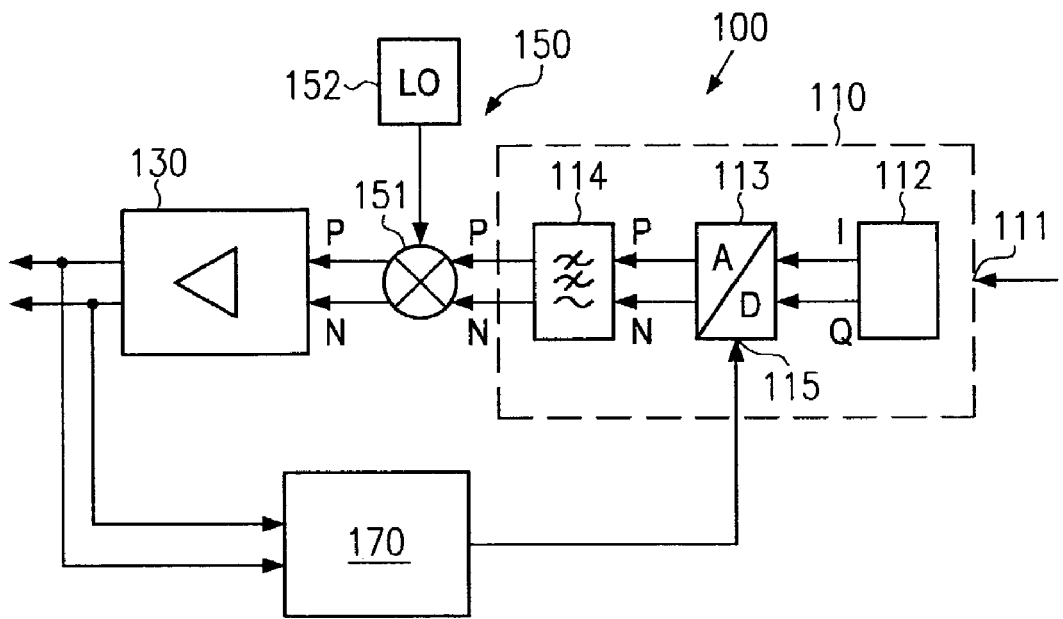
FIG. 1a schematically shows a circuit diagram representing a transmitter device including an automatic power level control in accordance with one illustrative embodiment.

While the present invention is described with reference to the embodiments as illustrated in the following detailed description as well as in the drawings, it should be understood that the following detailed description as well as the drawings are not intended to limit the present invention to the particular illustrative embodiments disclosed, but rather the described illustrative embodiments merely exemplify the various aspects of the present invention, the scope of which is defined by the appended claims.

It should be noted that in the following reference will be made to a transceiver device used for wireless LAN applications that allows a two-way communication between a host unit and a remote device. Irrespective whether or which data transfer protocols may be used in such a wireless communication and irrespective of the radio frequency employed in these devices, the concept of the present invention may readily be applied to any transceiver device that requires an automated power level control of the radio frequency output. Moreover, the present invention is not limited to LAN applications typically providing a transmission range of approximately 100 meters, but is also applicable to any transceiver device as, for example, used in mobile phones in which controlling of a transmission power may also be advantageous in view of power consumption and reduced interference.

FIG. 1a schematically shows a circuit diagram of a transmitter circuit 100 that may be used in a transceiver device (not shown) for transferring data to a remote device. The transmitter circuit 100 comprises a base band stage 110, a radio frequency output stage 130, a modulation stage 150 and an automated power level control circuit 170.

The base band stage 110 includes an input 111 to receive a base band signal in digital form. The transmitter circuit 100 shown in FIG. 1a represents a so-called direct conversion architecture that may be advantageous in view of power consumption and the potential of a high degree of integration, and therefore an I-Q converter 112 is provided, which allows to generate an in-phase (I) signal and a quadrature (Q) signal from the base band signal received at the input 111. A digital to analog converter (DAC) 113 is connected with its digital input to the I-Q converter 112 and is connected with its analog output to a base band filter 114. It should be noted that, for the sake of simplicity, merely one signal channel is shown at the output of the DAC 113 and in the following signal path, wherein the signal path is shown as a differential signal path, the differential branches being indicated by P and N, respectively. Thus, the signal path indicated by P is to represent the positive signal components of the analog I and Q signals. The same holds true for the negative signal components. The DAC 113 further comprises a control voltage input 115 for receiving a control voltage to adjust an offset and thus an amplitude of the converted analog signal.

The base band stage 110 is connected to the modulation section 150 via a mixer circuit 151 configured to receive the filtered base band signal and a radio frequency signal produced by a local oscillator 152. An output of the mixer circuit 151 is connected to the output power stage 130 which, in one embodiment, is configured as an "open loop" amplifier stage, i.e. essentially no RF feedback is provided within the output power stage 130. In another embodiment, a power back off capability may be implemented, for example in the form of a capacitive voltage divider located at an input of the output stage 130, which allows to select a desired "open loop" gain of the output power stage 130. Providing the output power stage 130 as an open loop RF amplifier system significantly reduces complexity, i.e. the number of RF components, thereby facilitating integration of the output stage 130 while minimizing the required chip area.

An output of the output stage 130 is connected to the automatic power level control (APLC) circuit 170, which is adapted to detect an output power level and to generate in response to the detected output power level an appropriate control voltage supplied to the control voltage input 115 of the DAC 113.

In operation, the transmitter circuit 100 may be initialized, wherein the APLC circuit 170 is reset. That is, the control voltage supplied to the DAC 113 via the control voltage input 115 is set to a predefined start value, for example to a minimum value so that an analog output signal of the DAC 113 is minimal. Moreover, during the initialization of the transmitter circuit 100 the APLC circuit 170 may ignore an output signal of the output stage 130 in order to allow the settling of any input signals, control signals, reference signals, and the like, that may be used during the operation of the APLC circuit 170.

The base band signal provided at the input 111 is converted into an in-phase signal and a quadrature phase signal, which in turn is converted into an analog signal by the DAC 113, wherein the control voltage provided by the APLC circuit 170 substantially determines the DC level and thus the magnitude of the analog base band signal. The analog signal is then shaped in the base band filter 114 and the filtered base band signal is then up-converted by mixing it with the carrier frequency provided by the local oscillator 152. The modulated RF signal is then amplified by the output stage 130 and may be delivered to an antenna (not shown), wherein the modulated output signal is monitored by the APLC circuit 170.

To this end, the modulated output signal or a defined fraction thereof may be rectified and compared with one or more reference values to establish on the basis of the comparison result the appropriate control voltage supplied to the DAC 113. For example, if the comparison result indicates an output power of the output stage 130 as being too high, the control voltage of the DAC 113 may be reduced by a predefined amount so as to reduce the amplitude of the analog base band signal, thereby reducing the output level of the output stage 130. Since the control loop for adjusting the output power level is provided between the RF side and the base band side via the APLC circuit 170, the number of required RF components in the transmitter circuit 100 may be minimized. Moreover, the regulation of the RF output level is completely carried out at the base band side so that a higher degree of accuracy may be obtained than in the case of a conventional approach, in which a feedback is provided at the RF side.

In one particular embodiment, the control operation of the APLC circuit 170 is carried out in a time-discrete manner wherein during a first transmit cycle the output level of the output stage 130 is measured and the measurement result is used for the comparison to the predefined reference voltage to adjust the control voltage for the DAC 113 after the completion of the first transmit cycle and prior to the begin of a subsequent second transmit cycle. Thus, the newly adjusted DAC 113 has settled prior to the begin of a new transmit cycle, thereby reducing or even substantially completely avoiding any base band signal distortions that may be caused by changing the setting of the DAC 113 during a transmit cycle.

In another embodiment, the APLC circuit 170 is configured to increase/decrease the control voltage of the DAC 113 by a single predefined step for each new transmit cycle, when the comparison of the measurement of the output power with a predefined reference voltage indicating a desired output level signals that the output level is too high or too low, respectively. Due to this time-discrete control operation, improved stability of the control loop is accomplished, wherein for example initializing the APLC circuit 170 with the minimum control voltage for the DAC 113 ensures that a maximum permissible output power is not exceeded even during the first few transmit cycles after initialization of the transmitter circuit 100.

Figure 1B:
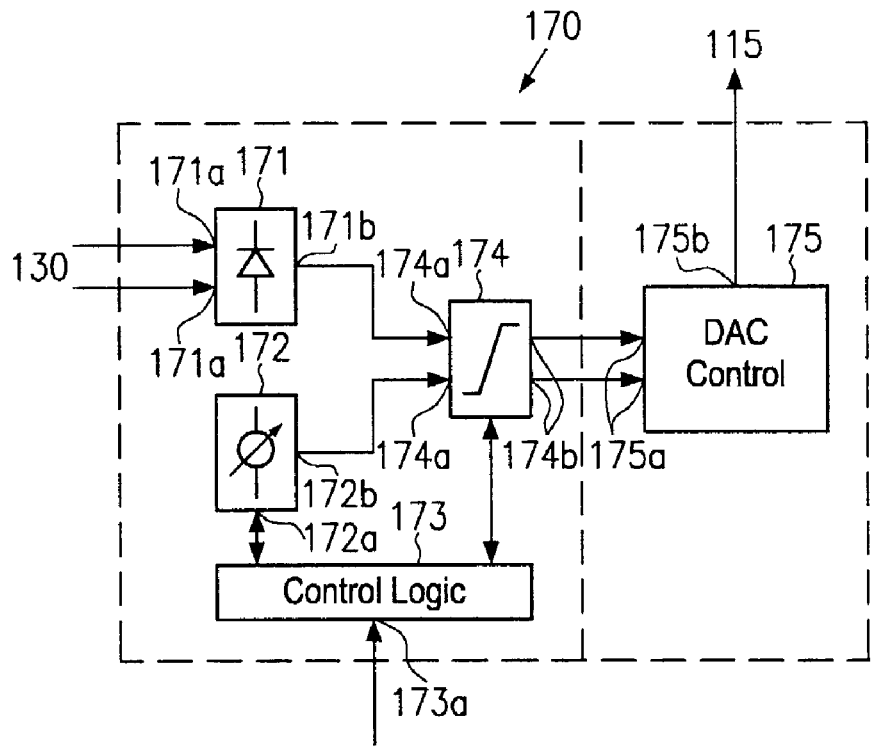
FIG. 1b schematically shows a more detailed circuit diagram of an automatic power level control according to a further illustrative embodiment.

FIG. 1b schematically shows a block diagram of the APLC circuit 170 according to further illustrative embodiments. In FIG. 1b, the APLC circuit 170 comprises a rectifying circuit 171 having an input 171a for receiving the RF signal of the output stage 130, and an output 171b to provide a DC signal indicative of a signal received at the input 171a. The rectifying circuit 171 may be implemented in the form of an envelope detector as is well known in the art for measuring radio frequency signals. Moreover, the APLC circuit 170 comprises a reference voltage circuit 172 having an output 172b for providing a specified reference voltage. Moreover, the reference voltage circuit 172 comprises an input 172a that is configured to receive a control signal from a control logic 173 to provide a reference voltage on the basis of the control signal supplied by the control logic 173. A comparator circuit 174 comprises an input 174a connected to the outputs 171b and 172b of the rectifying circuit 171 and the reference voltage circuit 172, respectively. That is, the input 174a may be configured to receive signals from the rectifying circuit 171 and from the reference voltage circuit 172 simultaneously or receive the signals thereof successively, for example each signal for a predefined time period. In one particular embodiment, the reference voltage circuit 172 may provide a first and a second reference voltage sequentially, so that the signal supplied by the rectifying circuit may be compared with the first and the second reference voltage, respectively. The comparator circuit 174 may comprise a control input 174c that is connected to the control logic 173. Moreover, the comparator circuit 174 comprises an output 174b configured to provide one or more signals indicative of the results of the comparison of the signals provided at the input 174a. The APLC circuit 170 further comprises a DAC control circuit 175 having an input 175a for receiving the one or more signals output by the comparator circuit 174, and having an output 175b that is connected to the input 115 of the DAC 113.

Figure 2:
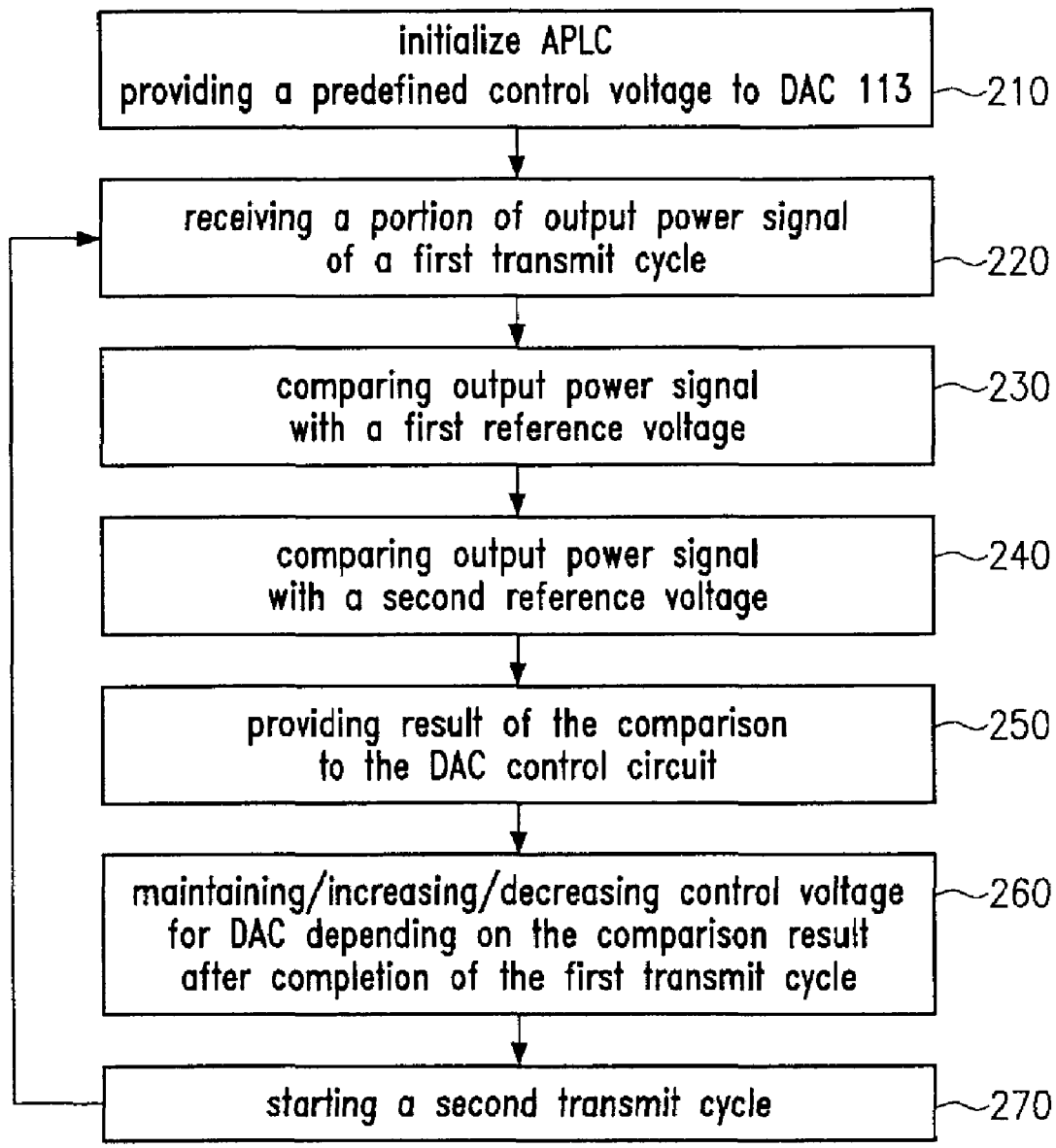
FIG. 2 is a flow chart illustrating operation of an automatic power level control circuit according to various illustrative embodiments.

The operation of the APLC circuit 170 as shown in FIG. 1b will be described with reference to the flow chart shown in FIG. 2.

In step 210 the APLC circuit 170 is initialized prior to a first transmit cycle, wherein the DAC control circuit 175 provides a predefined control voltage to the input 115 of the DAC 113. As previously noted, it may be advantageous to provide the control voltage in a manner to obtain a minimum output power so that exceeding of a possibly defined maximum output power is prevented. In other embodiments, it may be preferable to start a first transmit cycle with a differently selected DAC setting, for example a maximum output power may be appropriate in some applications or an intermediate value may be selected.

In step 220 the output power signal delivered by the output power stage 130, or at least a defined portion thereof, is received by the input 171a of the rectifying circuit 171. The modulated RF signal at the input 171a is converted into a DC based signal indicating the output power of the output power stage 130. A first and a second reference voltage are generated within the reference voltage circuit 172, wherein a magnitude of the first and second reference voltages may be selected in accordance with a signal supplied by the control logic 173. In one embodiment, the control logic may be programmable, as indicated by input 173a, so as to preselect a desired output level of the output stage 130. The control logic 173 then selects appropriate values for the first and second reference voltages, for example by selecting a respective node of a voltage divider, and the like.

In step 230 the signal provided by the output 171b of the rectifying circuit 171 is compared with the first reference voltage in the comparator circuit 174. For example, the first reference voltage may be selected so as to indicate an output power exceeding the desired output power by a predetermined amount.

In step 240 the signal indicative of the output power is compared with the second reference voltage wherein, in one embodiment, the first and the second reference voltages are supplied successively to the comparator circuit 174, wherein a point in time and a duration of supplying the first and the second reference voltages may be controlled by the control logic 173. In this way, merely a single comparator stage is required for the comparison of the first and second reference voltage with the output power indicative signal. In other embodiments, the comparator circuit 174 may be configured to allow a simultaneous comparison by providing two or more comparator stages. Moreover, in one embodiment the second reference voltage may be selected to represent a value indicating an output power level that is considered too low so that the first and second reference voltages may represent upper and lower limits for the desired target output level.

In step 250 the result of the comparison is provided at the output 174b after a predefined time interval. For instance, upon completion of the first transmit cycle the comparison result may be provided. In one embodiment, the output 174b comprises two signal lines, wherein a first signal line conveys a comparison result with the first reference voltage, whereas a second signal line conveys the comparison result with the second reference voltage. Thus, by providing the first and second signal lines at the output 174b four different states of the comparator circuit 174 may be represented in a digital manner. For example, a high level at the first signal line may represent an output power level that is too high, whereas a high level at the second signal line may represent an output power level that is too low, and a low level at both signal lines may indicate an acceptable output power level. A high level at both signal lines may indicate a non operational mode of the comparator circuit 174 and may be used, for example, during a start-up phase to indicate to the DAC control circuit 175 that any reference voltages are not yet settled. As may readily be appreciated, any other appropriate assignments of logic levels for the first and second signal lines may be selected. Moreover, more than two reference voltages for a respective target output level may be provided for the benefit of a reduced settling time of the output stage 130, while increasing the number of circuit elements required in the APLC circuit 170.

In step 260 the DAC control circuit 175 establishes an appropriate control voltage for the DAC 113 upon completion of the first transmit cycle wherein, in one particular embodiment, the comparison result is represented by a two bit number, which indicates whether the control voltage is to be maintained, to be increased or to be decreased or whether the comparator circuit 174 is in a non-operational mode. If the two bit number indicates that the control voltage supplied to the DAC 113 is to be changed, the control voltage may be increased or decreased, depending on the value of the two bit number, by a predefined step. For instance, if it is desired to control the output power of the output stage 130 with a "resolution" of 1 db, the first and second reference voltages generated by the reference voltage circuit 172 are selected so as to be separated by approximately 1 db whereas the step size in changing of the control voltage for the DAC 113 is selected to produce a change in the output power level of approximately 0.5 dB. As is readily appreciated any appropriate step size may be selected in accordance with device-specific requirements.

In step 270 a second transmit cycle is started with the newly adjusted control voltage for the DAC 113 and thus with the newly adjusted output power level of the output stage 130. The process flow then returns to step 220 and repeats the subsequent process steps to adjust or maintain the output power level to or at the target level.

In the embodiments in which the output power level is represented by a two bit number, a couple of transmit cycles may be necessary to reach the desired target output level upon initializing the APLC circuit 170. However, in this way the output power level may be adjusted in a reliable and effective manner with a minimum of circuit components, especially at the RF side. Additionally, only a small number of control signals is required for accomplishing the output power control.

It should be noted that, although the above process flow is described in view of maintaining the output power level at a single predefined target level, the APLC circuit 170 may also advantageously be used for controlling the output power level in accordance with other criteria, such as temperature of the output stage 130, distance of the transmitter circuit 100 from a receiver device, power consumption of the transmitter circuit 100, and the like. This may require to select a different target level and to correspondingly adapt as output of the reference voltage circuit 172, such as the first and second reference voltages, to the newly-selected target level.

If the settling time, i.e. the number of transmit cycles required for achieving the desired output power level, is to be reduced, a plurality of appropriate reference voltages, such as the first and the second reference voltages of the reference voltage circuit 172 may be provided so that the DAC control circuit 175 may respond to the comparison results by more accurately adjusting the control voltage newly supplied to the DAC 113, thereby reducing the number of adaptation steps.

As a result, by providing a control loop for adjusting an output power level of a transmitter, which is established between the RF side and the base band side, an accurate control is achieved, wherein the number of RF components may be kept minimal, especially when an "open loop" type RF output stage is provided.

Moreover, the time-discrete control operation, that is, measuring the RF level in one transmit cycle and readjusting the output level prior to a subsequent transmit cycle, results in a stable operation of the control loop, substantially without causing overshootings and undershootings.

Further modifications and variations of the present invention will be apparent to those skilled in the art in view of this description. Accordingly, the description is to be construed as illustrative only and is for the purpose of teaching those skilled in the art the general manner of carrying out the present invention.

The invention claimed is:

1. A radio frequency transmitter comprising:
a baseband frequency stage including a digital to analog converter having an input for receiving an adjustable control voltage, inputs for receiving an in-phase (I) signal and a quadrature (Q) signal and outputs for corresponding analog signal components;
a radio frequency output stage; and
a power level control circuit including:
a detector circuit having a detector input and a detector output, the detector input being connected to said radio frequency output stage; and
a comparator circuit having a comparator input and a comparator output, said comparator input being configured to receive an output signal from said detector output and a reference signal, wherein said comparator output is connected to said digital analog converter to provide the adjustable control voltage on the basis of the detector output signal and the reference signal, wherein the comparator circuit includes a digital to analog converter control circuit and a comparator section, wherein the comparator section is configured to provide a comparison result in the form of at least one digital signal to said digital to analog converter control circuit, wherein said digital signal indicates when an output power of said output stage exceeds a first threshold, and wherein said digital signal indicates when an output power of said output stage is lower than a second threshold, wherein the second threshold is lower than said first threshold.

2. The transmitter of claim 1, wherein the power level control circuit further includes a reference voltage circuit connected to said comparator circuit and configured to provide at least a first and a second reference voltage.

3. The transmitter of claim 2, wherein said power level control circuit further comprises a control logic connected to said reference voltage circuit and configured to select a value of each of the at least one first and second reference voltages.

4. The transmitter of claim 3, wherein said control logic is further configured to allow to externally select a value of the at least one first and second reference voltages.

5. The transmitter of claim 1, wherein said power level control circuit is further configured to provide said reference signal to the digital to analog converter after completion of a transmit cycle and prior to the begin of a subsequent transmit cycle.

6. The transmitter of claim 1, wherein said transmitter is comprised of a direct-conversion architecture.

7. The transmitter of claim 6, wherein said output stage comprises open loop amplifier.

8. The transmitter of claim 7, wherein said open loop amplifier comprises a power backoff stage at an input thereof.

9. A method of controlling an output power level of a radio frequency (RF) transmitter, the method comprising:
  detecting the output power level during a first transmit cycle to obtain a detection signal, wherein said detecting is performed by a detector coupled to a radio frequency stage of the RF transmitter;
  comparing said detection signal of said first transmit cycle with a predefined reference signal to generate a control signal, wherein said control signal represents a digital signal, and wherein said digital signal represents a two bit number; and
  controlling the output power level of a second transmit cycle, wherein said controlling is performed by controlling a base band signal of said RF transmitter on the basis of said control signal.

10. The method of claim 9, wherein said reference signal includes at least a first threshold and a second threshold.

11. The method of claim 9, wherein said base band signal is step-wise changed with a predefined step size.

12. The method of claim 11, wherein said base band signal is step-wise controlled.

13. A method of controlling an RF output power level of a direct-conversion transceiver device for WLAN application, the method comprising:
  detecting the output power level, wherein said detecting is performed by a detector coupled to an output of a power amplifier of the direct conversion transceiver device;
  establishing a control signal on the basis of said detection, wherein said control signal indicates at least one of a first state wherein power exceeds a first threshold, a second state wherein power is less than a second threshold and a third state wherein power is between the first and second thresholds; and
  controlling a base band signal on the basis of said control signal to adjust said output power level;
  wherein detecting said output power level is carried out during a first transmit cycle and controlling said base band signal is carried out after said first transmit cycle and prior to a second transmit cycle; and
  wherein controlling said base band signal includes step-wise changing a DC level of said base band signal.

14. The method of claim 13, wherein controlling said base band signal includes controlling a control voltage during a digital to analog conversion of a digital input signal.

15. The method of claim 14, wherein said control voltage is changed by one predefined step when said control signals indicates one of a power-too-high state and a power-too-low state.

16. The method of claim 15, wherein said control voltage is set to a predefined default value during initializing said transceiver device.

17. The method of claim 16, wherein said predefined default value effects a minimum output power level.

* * * * *